United States Patent [19]

Nakashima et al.

[11] Patent Number: 5,083,114
[45] Date of Patent: Jan. 21, 1992

[54] GROUND FAULT INDICATING DEVICE

[75] Inventors: Yasuhiro Nakashima, Kakamigahara; Norio Kondo, Nagoya; Satoshi Morikawa, Aichi, all of Japan

[73] Assignee: NGK Insulators, Ltd., Nagoya, Japan

[21] Appl. No.: 589,117

[22] Filed: Sep. 27, 1990

[30] Foreign Application Priority Data

Sep. 28, 1989 [JP]  Japan ................................ 1-252817
Nov. 8, 1989 [JP]  Japan ................................ 1-291985

[51] Int. Cl.⁵ .......................................... G01W 1/00
[52] U.S. Cl. .................................. 340/601; 340/650; 73/170 R; 324/72
[58] Field of Search ................ 340/600, 601, 650; 324/72, 133; 73/170 R; 361/93

[56] References Cited

U.S. PATENT DOCUMENTS 3,891,919  6/1975  Penninger .................. 340/601 X
4,276,576  6/1981  Uman et al. ............... 340/601 X

FOREIGN PATENT DOCUMENTS 47-25875  8/1972  Japan .
56-89063  7/1981  Japan .

Primary Examiner—Jin F. Ng
Assistant Examiner—Jeffery A. Hofsass
Attorney, Agent, or Firm—Armstrong, Nikaido, Marmelstein, Kubovcik & Murray

[57] ABSTRACT

A current transformer detects a ground fault current and outputs a secondary current signal to heat a filament disposed in an airtight flash lamp upon the occurrence of a ground fault. With heating of the filament, an ignition material is ignited in the lamp and causes weakening of the glass bulb of the lamp. A moving member pressing against the lamp shatters the weakened lamp and is displaced, thus releasing an indicator to project from a holder to a ground fault indicating position.

22 Claims, 6 Drawing Sheets

Fig. 6
Fig. 7
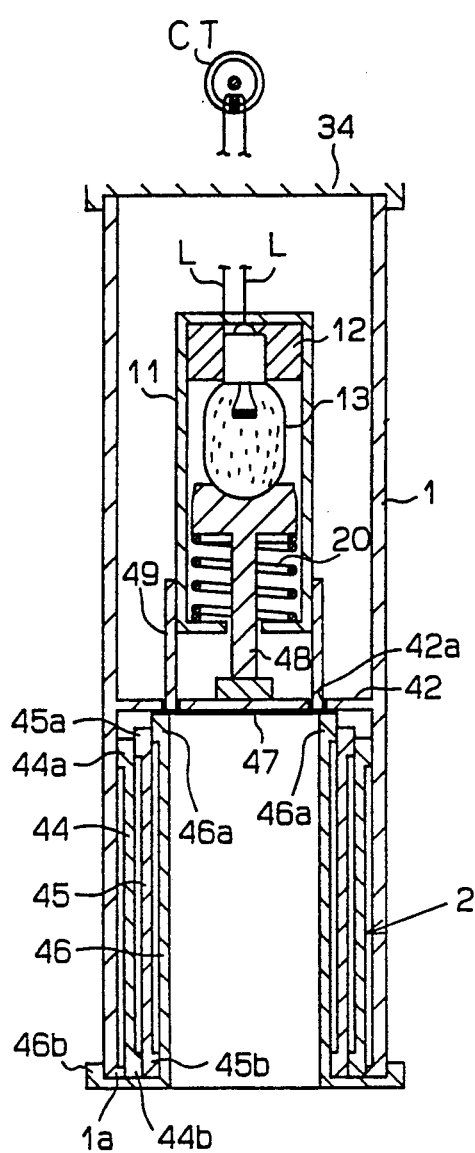
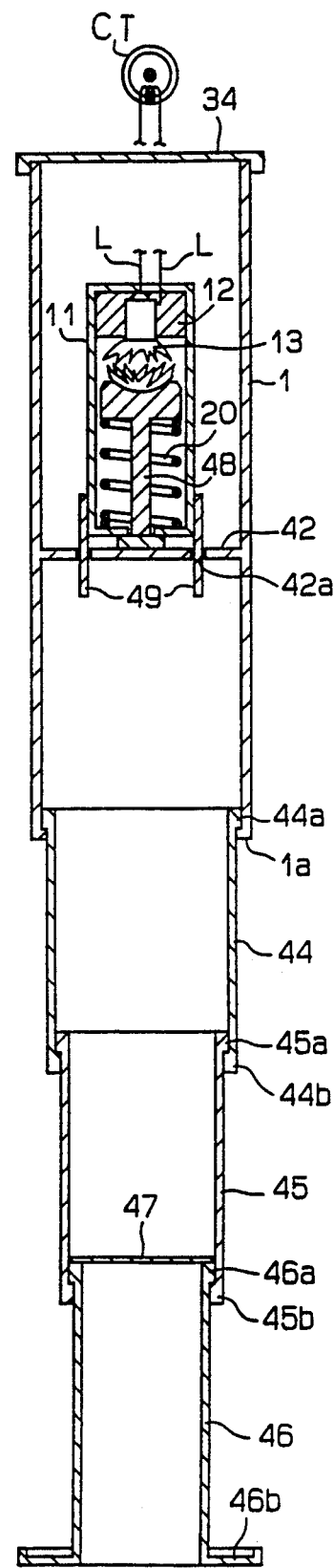

GROUND FAULT INDICATING DEVICE

This application claims the priority of Japanese Patent Application Nos. 01-252817 filed on Sept. 28, 1989 and 01-291985 filed on Nov. 8, 1989 which are incorporated herein by reference.

BACKGROUND OF THE INVENTION

1. Field of the Invention

The present invention relates generally to a ground fault indicating device. More particularly, a device for indicating locations of ground fault which occur when lightning strikes transmission lines is proposed.

2. Description of the Related Art

Ground fault indicating devices are generally known. A typical indicating device of a related art is disclosed in Japanese Utility Model Examined Publication No. 47-25875. The indicating device disclosed therein has a flash lamp as an indicator. Paint is applied to either an external surface or an internal surface of the flash lamp. The paint is made of a compound which changes its color in accordance with a temperature change. When a current transformer (CT) detects a ground fault current, the current from a secondary current transformer discharges the flash lamp. Thus, the color of the paint is changed by a heat generated by the flashing of the flash lamp, so as to indicate the occurance of a ground fault strike.

In this device, however, the flash lamp is a very small indicator. Therefore, recognizing the location of a ground fault with the flash lamp indicator from a distance is very difficult.

Another type of the indicating device is also disclosed in the above Japanese Utility Model Publication No. 47-25875. In the second device, an indication bar is normally accommodated in a housing. When the current transformer detects a ground fault current, a solenoid coil is energized to protrude the indication bar out of the housing.

In this device, the indication bar is large enough to recognize its protrusion from the distance. However, the required solenoid coil is quite expensive to produce.

In addition to the foregoing devices, another type of the device has been also known. In this device, a secondary current outputted by a current transformer which has detected a ground fault current heats a filament to ignite an explosive. The explosion energy of the explosive protrudes a pipe shape indicator.

However, the housing is exposed to the atmosphere and is liable to deteriorate after an extended use. When the airtightness of the housing deteriorates, the filament and the explosive are exposed to the humidity in the atmosphere. Thus, the ignitability of the filament and of the explosive is significantly lowered, so that the indicator will not function even when lightning strikes and causes a ground fault. Therefore, the housing must be replaced every five years in this type of the device to insure a good airtightness. Accordingly, the costs of using such devices are relatively high due to their short lifespan.

SUMMARY OF THE INVENTION

Accordingly, a primary object of the present invention is to provide a ground fault indicating device wherein an indicator actuator having a filament and an ignition material therein has a good airtightness so as to make the device accurately function when ground fault current is detected. In addition, it is an objective that the device be suitable for extended use and be producable at a low cost.

Another object of the present invention is to provide ground fault indicating device wherein an indicating operation when a lightning strike causes a ground fault is accurately performed and the indication can be recognized easily.

Still another object of the present invention is to provide a ground fault indicating device which can be produced easily.

Still another object of the present invention is to provide a ground fault indicating device which can easily be set again after a ground fault has been detected.

Still another object of the present invention is to provide a ground fault indicating device wherein an indicator actuator which has been broken due to combustion of an ignition material can be easily replaced after a ground fault is once indicated.

To achieve the foregoing and other objects and in accordance with the purpose of the present invention, an improved ground fault indicating device is provided. According to the present invention, the device has an indicator which can be selectively switched between a normal position and a ground fault indicating position upon the detection of a ground fault. The device also has a current transformer that detects the voltage surge associated with a ground fault and outputs a corresponding secondary current. A flash lamp which has an airtight bulb accomodates a filament and an ignition material within the bulb. The filament is heated by the secondary current produced by the ground fault and ignites the ignition material in responce thereto. The strength of the bulb is lowered when the bulb is heated due to combustion of the ignition material. A pressing member applies pressure against the bulb of the flash lamp. The pressing member smashes the bulb and is displaced when the bulb is heated and its strength is lowered. A position shifter is connected to the pressing member and keeps holding the indicator at the normal position when the pressing member presses against the bulb. The position shifter releases and shifts the indicator to the indicating position when the bulb is smashed and the pressing member is displaced.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

FIG. 6 is a vertically sectional view of an indicating device of a second embodiment in a non-indicating condition.

FIG. 7 is a vertically sectional view of the indicating device shown in FIG. 6 in an indicating condition.

DETAILED DESCRIPTION OF THE PREFERRED EMBODIMENT

Figure 1:
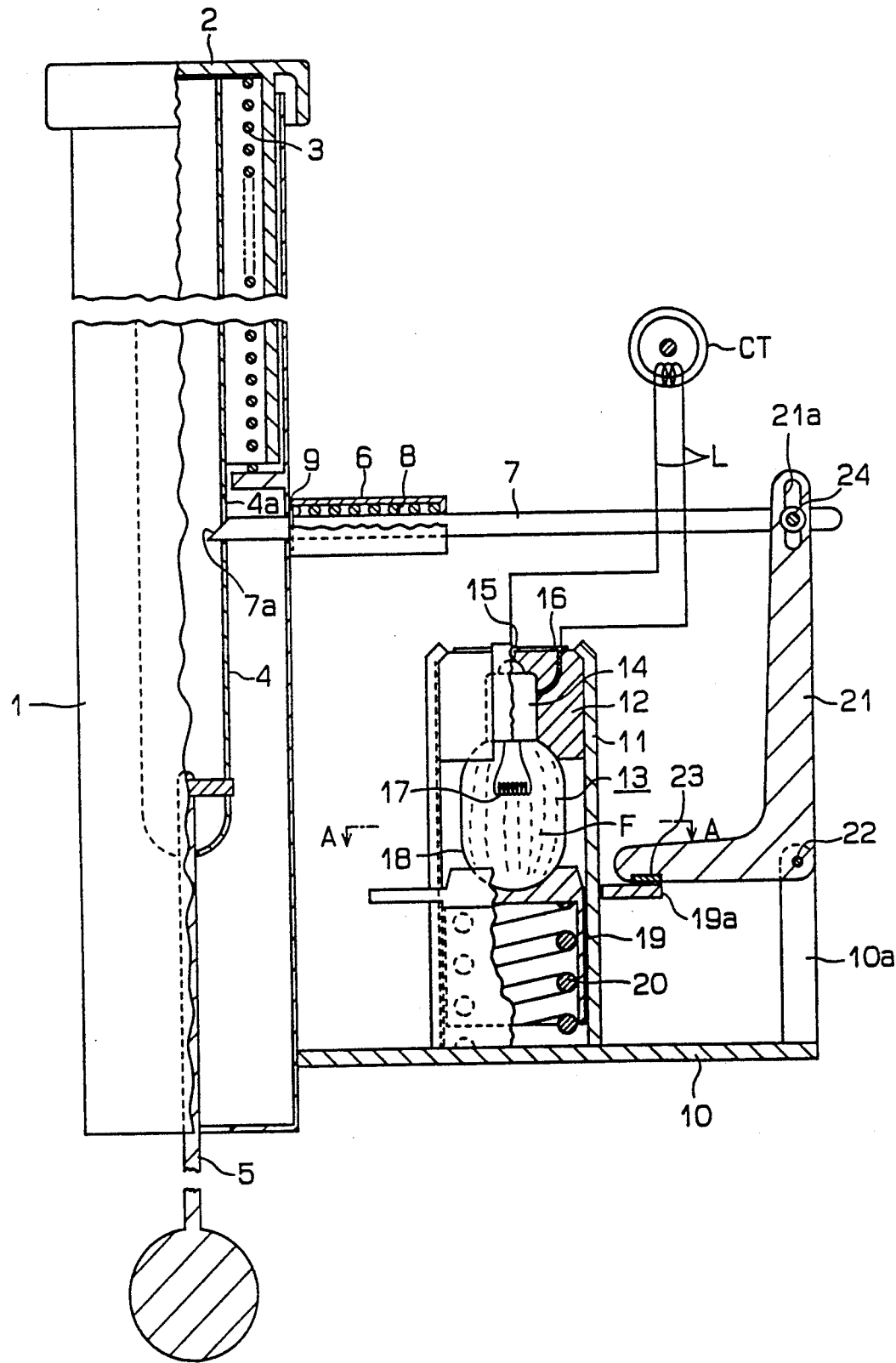
FIG. 1 is a sectional view of a ground fault indicating device of a first embodiment of the present invention, in a non-indicating condition.

As illustrated in the drawings, a preferred first embodiment of the present invention will be described in detail hereinafter.

As shown in FIG. 1, a cylindrical holder 1 accommodates an indicator 2 at an upper portion thereof. The indicator 2 has an integral lid and can move vertically relative to the holder 1. The indicator 2 is always urged upward by means of a compression spring 3. The indicator 2 has a small diameter inner pipe 4 therein having its upper end fixed to a bottom surface of the lid of the indicator 2. The inner pipe 4 extends downward to a lower portion of the holder 1 and has a drawing rope 5 connected to its lower end.

The indicator 2 is large enough to be recognized from the distance and the outer surface thereof is painted with a bright color so as to be seen by anyone. The indicator 2 is normally accommodated in the holder 1 completely so as to be held in the non-indicating position shown in FIG. 1. When a lightning strikes causing a ground fault, the indicator 2 moves upward and protrudes from the holder 1 so as to be held in the indicating position shown in FIG. 2. Thus, when a ground fault occurs, the indicator 2 can be easily recognized.

An attachment pipe 6 is fixed to the holder 1 perpendicularly thereto at a position half way up the holder 1. The attachment pipe 6 supports a lock bar 7 and position shifting means therein. The lock bar 7 can move relative to the attachment pipe 6 in a direction perpendicular to the longitudinal direction of the holder 1. A ring 9 is disposed adjacent to a tip of the lock bar 7 and a coil spring 8 is provided between the ring 9 and an end wall of the attachment pipe 6. The coil spring 8 working with the ring 9 always urges the lock bar 7 toward the holder 1, and the lock bar 7 is always held at a hooking position where the tip of the lock bar 7 is inserted into a hole 4a of the inner pipe 4. Thus, the lock bar 7 holds the indicator 2 at a normal position (the non-indicating position) against the urging force of the spring 3.

When the lock bar 7 is moved in a direction toward its proximal end (right in FIG. 1), the tip of the lock bar 7 is withdrawn from the hole 4a. Then, the indicator 2 together with the inner pipe 4 is moved upward to the indicating position by means of the spring 3.

An attachment plate 10 is supported by a lower outer surface of the holder 1 at one end thereof and extends horizontally. The attachment plate 10 carries a housing 11. The housing 11 stands upright on the attachment plate 10. An insulated gripper 12 is inserted and mounted in an upper portion of the housing 11. The gripper 12 has a socket 14 of a flash lamp 13 inserted and fixed therein and electrodes 15 and 16 disposed on an upper surface thereof. The electrodes 15 and 16 are electrically connected to the socket 14 and also to a current transformer (CT) by means of associated leads L.

The flash lamp 13 has a bulb 18 made of glass which a filament 17. The filament 17 is heated when a current above a predetermined level outputted from the current transformer (CT) flows in the filament 17 for a predetermined amount of time by way of the leads L and the electrodes 15 and 16. The flash lamp 13 also accommodates combustion fibers F within the bulb 18. By way of example, the combustion fibers F may be made of strips of aluminum.

The housing 11 accommodates a cylindrical plunger 19 at a lower portion thereof. The plunger 19 has a lid integrated therewith and can move vertically relative to the housing 11. A compression spring 20 always urges the plunger 19 upward to press the plunger lid against a lower portion of the bulb 18.

Figure 3:
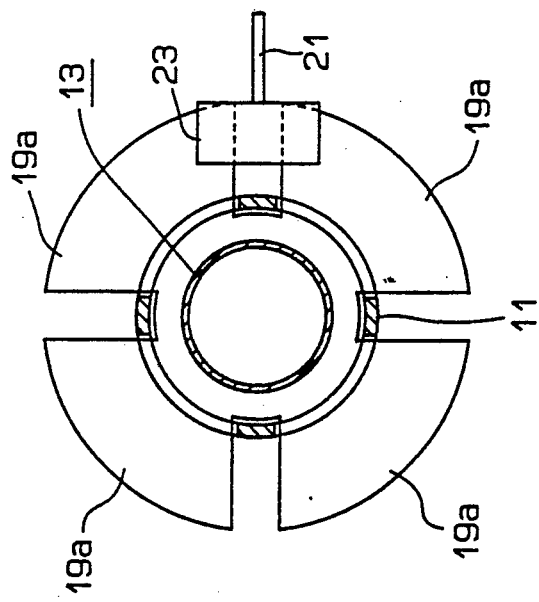
FIG. 3 is a sectional view taken along a line A—A of FIG. 1.

As shown in FIG. 3, the plunger 19 has a plurality of integral press segments 19a. In this embodiment, four press segments 19a are provided. These four press segments 19a extend radially through cutouts defined at the housing 11.

The attachment plate 10 has a supporting arm 10a standing upright at a tip thereof. The supporting arm 10a supports a middle portion of an L shape trip lever 21 by means of a pivot 22 at an upper end thereof. The trip lever 21 has a contact pad 23 attached to a lower surface of a horizontal end thereof. The contact pad 23 faces the press segment 19a with a slight space therebetween. An upper portion of the trip lever 21 has a slot 21a extending in the longitudinal direction thereof. An end of the lock bar 7 away from the holder 1 is rotatably connected to the lever 21 by means of a pin 24 inserted into the slot 21a so that the lock bar 7 can rotate about the axis of the pin 24.

The operation of the foregoing ground fault indicating device will be explained hereinafter.

When lightning strikes a transmission tower, an to which the device is installed, the current transformer (CT) detects the ground fault current caused by the lightning strike. The current transformer (CT) then outputs a secondary current to the filament 17 in the flash lamp 13 by way of the leads L and the electrodes 15 and 16. Then, heat is generated at the filament 17 and the combustion fibers F are rapidly burnt. Thus, the bulb 18 made of glass is also rapidly heated.

Because of the heat, a number of cracks develop in the bulb 18. The plunger 19 thus smashes the bulb 18 due to the pressing force of the spring 20. Therefore, the plunger 19 is moved upward.

Figure 2:
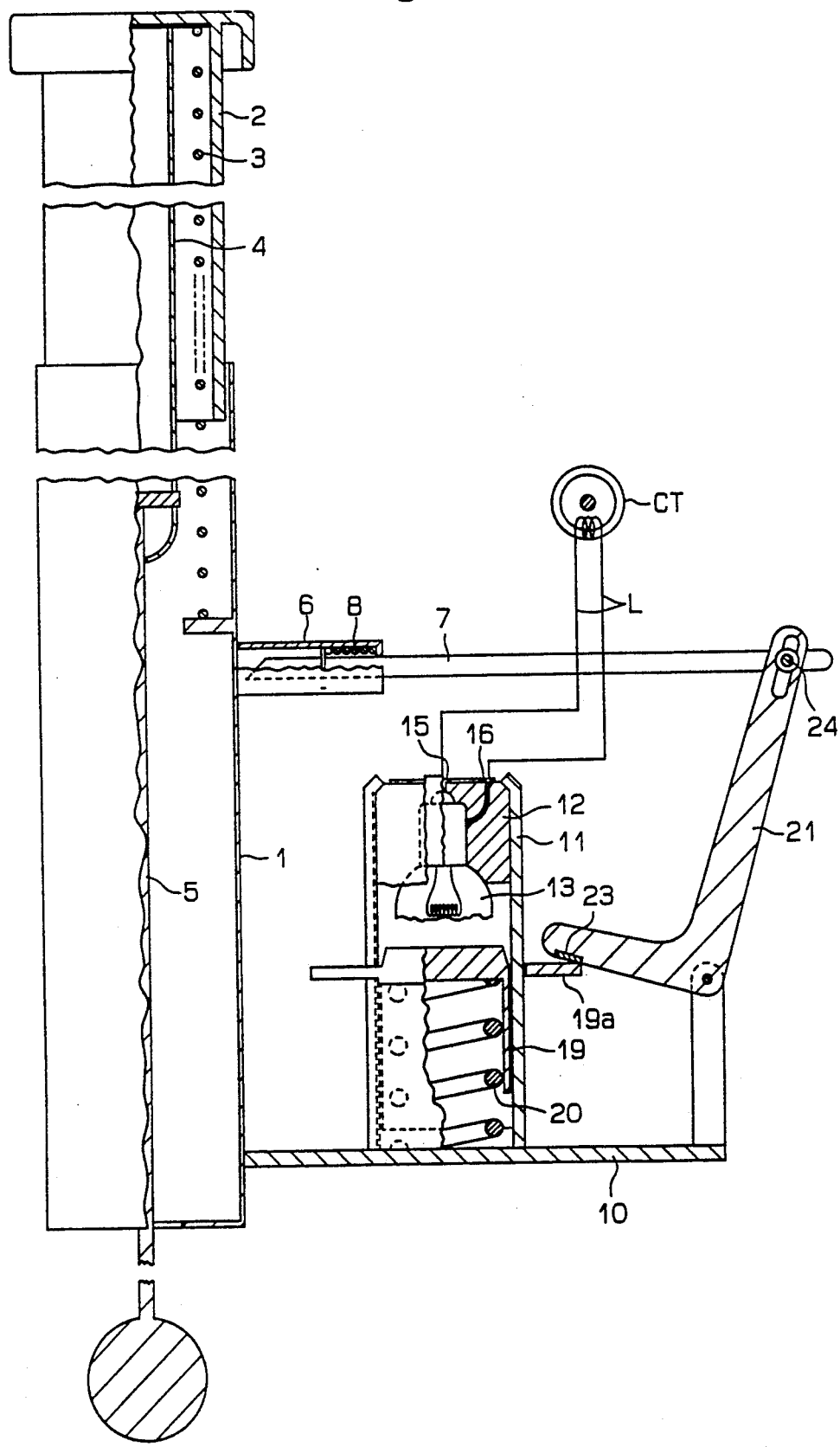
FIG. 2 is a sectional view of the indicating device indicating that a ground fault has occurred

Then, one of the press segments 19a lifts the contact pad 23 thereby rotating the trip lever 21 from a first position (shown in FIG. 1) to a second position (shown in FIG. 2). Thus, the lock bar 7 is moved away from the holder 1 (rightward in FIGS. 1 and 2) against the urging force of the spring 8. The tip of the lock bar 7 is withdrawn from the hole 4a of the inner pipe 4. Therefore, the indicator 2 together with the inner pipe 4 is moved upward to the indicating position. Thus, the indicator 2 protrudes upward from the holder 1 to indicate the ground fault.

In the condition shown in FIG. 2, the housing 11 must be replaced by a new one to facilitate reuse of the device. When the housing 11 having the shattered flash lamp 13 is detached from the attachment plate 10, the lock bar 7 is moved toward the holder 1 (leftward in FIG. 2) by means of the urging force of the spring 8 and the tip of the lock bar 7 comes adjacent a center of the inner pipe 4.

When the drawing rope 5 is pulled downward in the above condition, a arcuate surface at the lower end of the inner pipe 4 engages with a slanted tip 7a of the lock bar 7 to move the lock lever 7 rightward enabling the inner pipe 4 to be drawn down. When the hole 4a comes to a position aligned with the tip of the lock lever 7, the tip of the lock lever 7 is moved into the hole 4a by way of the urging force of the spring 8. Thus, the indicator 2 is held at the non-indicating (normal) position again.

In the operation of this device, the force of the spring 20 for moving the plunger 19 upward is significant. In the present embodiment, the pressing force of the spring 20 can be up to 100 Kg by way of example so as to insure the drawing out operation of the lock bar 7.

In this device, the filament 17 and the combustion fibers F are not exposed to the atmosphere. Thus there are no problems concerning weather and humidity resistance because the airtight bulb 18 made of glass accomodates the filament 17 and the combustion fibers F. Therefore, the flash lamp 13 does not have to be replaced unless it is shattered due to a fault current. Consequently, the ground fault indicating device of the present embodiment improves the durability and the operation reliability.

In addition, the flash lamps 13 are cheap, so that the indicator actuator can be produced at a low cost.

Figure 5:
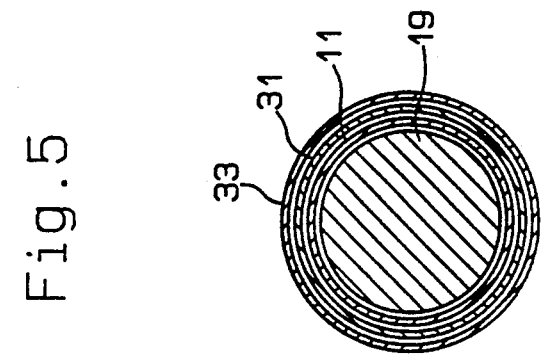
FIG. 5 is a sectional view taken along a line B—B of FIG. 4.
Figure 4:
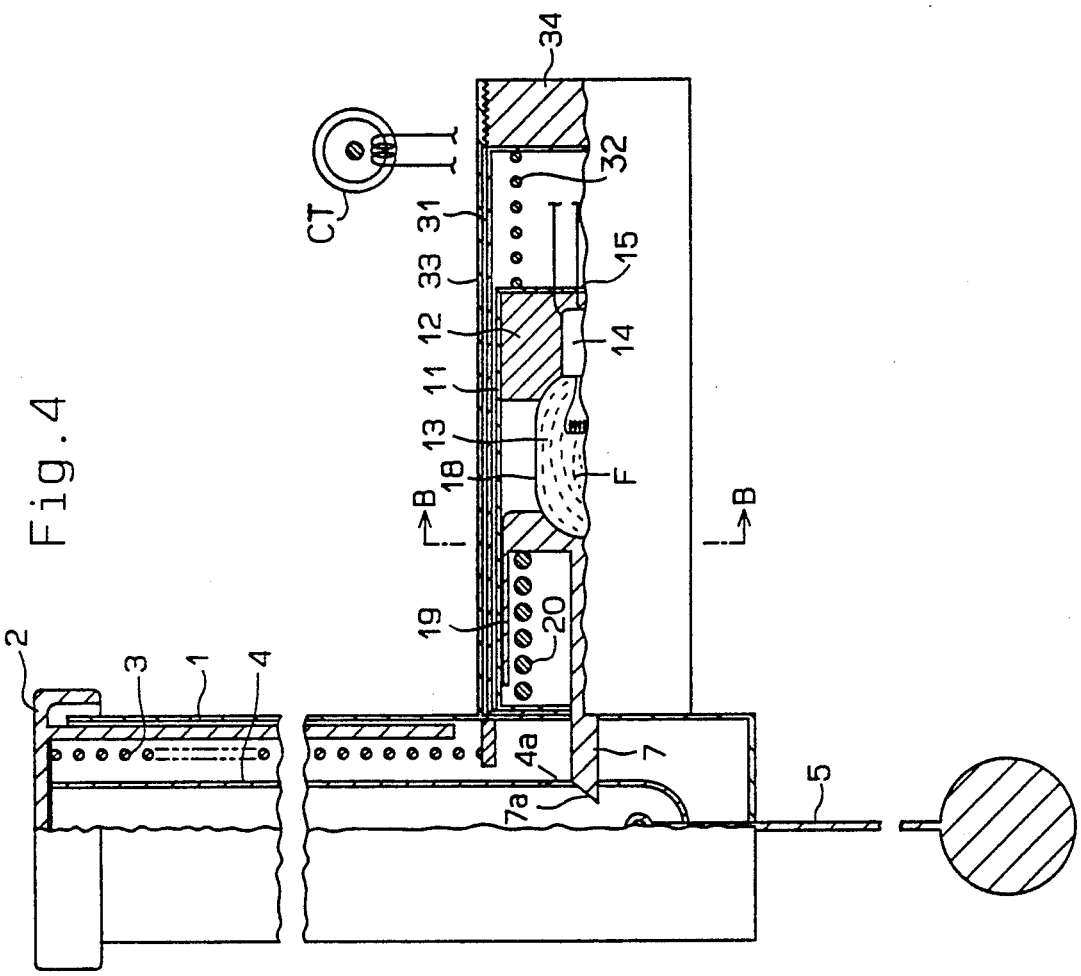
FIG. 4 is a sectional view of a modification of the first embodiment, in a non-indicating condition.

FIGS. 4 and 5 show a modification of the first embodiment.

In this modification, the inner housing 11 is fixed to the lower portion of the holder 1 and extends in a direction perpendicular to the holder 1. The lock bar 7 is integrally formed at a middle of the plunger 19. The inner housing 11 is disposed within an attachment pipe 31 and is always urged toward the holder 1 by means of a compression spring 32 fitted between a right end internal surface of the attachment pipe 31 and a right end external surface of the inner housing 11. The attachment pipe 31 is covered with an outer housing 33 which is fixed integrally to the holder 1. The outer housing 33 has an end plate 34 screwed to a right end portion thereof.

Protrusions and associated grooves (both are not shown) are disposed between the plunger 19 and the housing 11, between the housing 11 and the attachment pipe 31, and between the attachment pipe 31 and housing 33. The protrusions and the grooves work together to prevent rotation of the above members relative to one another, so that the tip of the lock bar 7 can be aligned with the hole 4a in a desirable posture.

When the flash lamp 13 is smashed by the plunger 19 in response to a ground fault indicating operation, the lock bar 7 is detached from the hole 4a to move the indicator 2 upward to the indicating position.

In order to change the housings 11, the end plate 34 is detached. After a new housing 11 is set, the drawing rope 5 is pulled downward. Then, the lock bar 7 engages with the inner pipe 4 to move the flash lamp 13 together with the housing 11 away from the holder 1 against the urging force of the spring 32. The spring 32 always keeps urging the housing 11 leftward (toward the holder 1) so as to insert the lock bar 7 into the hole 4a again.

A second embodiment of the present invention will be described in detail hereinafter according to FIGS. 6 and 7.

In the present embodiment, a cylindrical holder 1 has an end plate 34 at an upper end portion thereof. The holder 1 has an attachment plate 42 made of magnetic substance fixed to an inner surface in the middle of the holder 1. The holder 1 also accommodates a telescopic indicator 2 below the attachment plate 42.

The indicator 2 includes first to third telescopic segments 44 to 46 and a permanent magnet 47 as a position shifter attached to an upper end of the third telescopic segment 46.

In a non-indicating condition shown in FIG. 6, the permanent magnet 47 attracts the attachment plate 42 to accommodates the telescopic segments 44 to 46 successively. The third telescopic segment 46 has a large diameter capping portion 46b which is engaged with a lower end periphery of the holder 1. Lower end inner peripheries of the holder 1 and of the first and second telescopic segments 44, 45 have internally extending rims 1a, 44b and 45b respectively. Upper ends of the telescopic segments 44 to 46 have externally extending rims 44a to 46a respectively. In an indicating condition shown in FIG. 7, the capping portion 46b is detached from the lower end of the holder 1, and the rims 44a to 46a engage the rims 44b to 46b respectively to hold the telescopic segments 44 to 46 in the extended posture at the indicating position.

A piston 48 is disposed standing upright on the upper surface of the attachment plate 42 and supports a flash lamp 13 on an upper surface of a supporting portion thereof. The piston 48 supports the housing 11 by way of the flash lamp 13 and the housing 11 can move vertically relative to the piston 48. A spring 20 is interposed between the supporting portion of the piston 48 and a lower inner wall of the housing 11 and always urges the housing 11 downward. The housing 11 has a trigger cylinder 49 fixed to the lower end portion thereof. The trigger cylinder 49 projects downward through an insertion hole 42a defined on the attachment plate 42 and contacts the upper surface of the permanent magnet 47.

In this embodiment, when the secondary current associated with a ground fault flows in the flash lamp 13 and shatters the bulb 18, the housing 11 and the trigger 49 are instantly moved downward. The trigger 49 detaches the permanent magnet 47 from the attachment plate 42 against its attracting force. Thus, the telescopic segments 44 to 46 successively project from the holder 1 to indicate the occurrence of a ground fault.

In addition, the urging force of the spring 20 is sufficiently strong. Thus, even if the capping portion 46b is stuck to the lower end outer periphery of the holder 1 by means of iced snow or the like and a great amount of force is required to detach them, the telescopic segments 44 to 46 can be surely extended so as to indicate the fault.

Although only a couple embodiments of the present invention have been described herein, it should be apparent to those skilled in the art that the present invention may be embodied in many other specific forms without departing from the spirit or scope of the invention. Particularly, the following should be understood.

Figure 8:
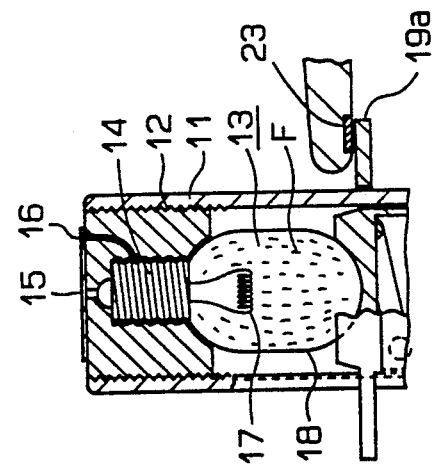
FIG. 8 is a partially sectional view of a modification of a flash lamp attachment design.

As shown in FIG. 8, the socket 14 of the flash lamp 13 may be detachablly inserted into the insulated gripper 12. The gripper 12 is screwed in the housing 11, so that the gripper 12 can be detached from the housing 11.

Figure 9:
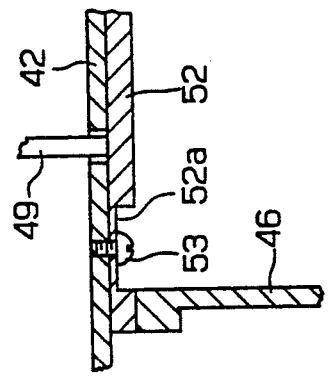
FIG. 9 is a partially sectional view of a modification of a coupling portion.

Instead of the attachment plate 42 and the permanent magnet 47, a coupling plate 52 having a thin portion 52a may be disposed on the upper end portion of the third telescopic segment 46 as shown in FIG. 9. The thin portion 52a is coupled to the attachment plate 42 by means of a screw 53. When the trigger cylinder 49 is moved downward rapidly, the thin portion 52a is broken to move the coupling plate 52 downward. In addition, it is also possible to adhere the upper end surface of the third telescopic segment 46 to the attachment plate 42 with an adhesive having a poor adhesive strength.

A weight (not shown) may be provided in an indicator accommodated in a holder 1 and when the lock bar 7 is detached, the indicator 2 projects downward by means of the weight to indicate the ground fault.

Therefore the present examples and embodiments are to be considered as illustrative and not restrictive and the invention is not to be limited to the details given herein, but may be modified within the scope of the appended claims.

What is claimed is:

1. A ground fault indicating device indicating the occurrence of a ground fault in an elecrical transmission line, the indicating device comprising:
    indicating means for being switched between a non-indicating position and a ground fault indicating position;
    detecting means for detecting the occurrence of a ground fault and outputting a drive signal in accordance with the detection of the accidental current;
    fuse means for self destructing in response to said drive signal, the fuse means including an airtight member, a heat generating member and ignition materials, the airtight member airtightly housing the heat generating member which is heated by the drive signal and the ignition material which is ignited in response to heating of the heat generating member;
    moving means positioned at an original position pressing against the airtight member, said moving means cooperating with the ignition material to shatter the airtight member and being displaced when the airtight member is shattered; and
    position shifting means for holding the indicating means at the non-indicating position when the moving means is positioned at the original position, said position shifting means releasing the indicating means and moving the indicating means to the ground fault indicating position when the moving means is displaced.

2. An indicating device as recited in claim 1 wherein said indicating means includes a cylindrical indicator protrudably accommodated in a cylindrical holder.

3. An indicating device as recited in claim 2 wherein said indicator is large enough to be easily recognized from a distance and an external surface thereof is colored.

4. An indicating device as recited in claim 1 wherein said detecting means is a current transformer which outputs the drive current upon detecting of a ground fault in the transmission line.

5. An indicating device as recited in claim 2 wherein said fuse means is a flash lamp having a filament as the heat generating member, combustion fibers as the ignition material and an airtight bulb as the air right member which houses the filament and the combustion fibers.

6. An indicating device as recited in claim 5 wherein said moving means includes a plunger which presses against the bulb when positioned at the original position, and is displaced when the bulb shatters.

7. An indicating device as recited in claim 6 wherein said position shifting means includes a lock bar that holds the indicator at the non-indicating position within the holder when the plunger is positioned at the original position, and which releases the indicator to the ground fault indicating position when the plunger is displaced.

8. An indicating device as recited in claim 7 wherein said lock bar is operationally connected to a trip lever rotatable in accordance with movements of the plunger.

9. An indicating device as recited in claim 7 wherein said lock bar is formed integrally with the plunger.

10. An indicating device as recited in claim 1 further comprising a drawing rope for bringing the indicating means from the ground fault indicating position back to the non-indicating position.

11. An indicating device as recited in claim 6 wherein the position shifting means comprises:
    a permanent magnet attracting an attachment plate to hold and accommodate the indicator in the holder so as not to move the indicator downward when the plunger is positioned at the original position; and forcing said attachment plate to move out of the magnetic field of the permanent magnet and allowing the indicator to project downward from the holder by its own weight when the plunger smashes the bulb.

12. An indicating device as recited in claim 11 wherein said position shifting means includes a trigger member forcing the permanent magnet to be moved away from the attachment plate when the plunger smashes the bulb.

13. An indicating device as recited in claim 12 wherein said trigger member is urged downward by means of a spring and a lower end of the trigger member contacts the indicator through a hole.

14. An indicating device as recited in claim 11 wherein said indicator includes a plurality of telescopic segments.

15. An indicating device as recited in claim 6 wherein said position shifting means includes:
    a coupling plate disposed at the upper end of the indicator and holding the indicator at the non-indicating position when the plunger is positioned at the original position; and
    a trigger member breaking the coupling plate so as to move the indicator downward to the short-circuit indicating position by its own weight when the plunger smashes the bulb and is displaced.

16. An indicating device as recited in claim 15 wherein said indicator includes a plurality of telescopic segments.

17. A ground fault indicating device for indicating the occurrence of a ground fault in a transmission line, the indicating device comprising:
    an indicator received within a holder so as to be switched between a non-indicating position and a ground fault indicating position upon the occurrence of a ground fault;
    a current transformer for detecting a ground fault current in the transmission line and outputting a drive signal in accordance with the detection of the ground fault current;
    a flash lamp having an airtight bulb made of glass, said bulb accommodating a filament and combustion fibers, said bulb shattering when the combustion fibers are ignited;
    a plunger positioned to press against the bulb, said plunger cooperating with the ignited combustion fibers to shatter the bulb when the flash lamp is ignited, the plunger being displaced when the bulb shatters; and
    a lock bar for holding the indicator at the non-indicating position within the holder when the plunger presses the bulb, said lock bar being retracted to allow the indicator to move to the ground fault indicating position when the plunger is displaced.

18. An indicating device as recited in claim 17 wherein said indicator is large enough to b easily recognized from the distance and an external surface thereof is colored.

19. An indicating device as recited in claim 17 wherein said lock bar is operationally connected to a trip lever which is rotated in accordance with movements of the plunger.

20. An indicating device as recited in claim 17 wherein said lock bar is formed integrally with the plunger.

21. A ground fault indicating device for indicating the occurrence of a ground fault in a transmission line, the indicating device comprising:
- an indicator received within a holder so as to be switched between a non-indicating position and a ground fault indicating position upon the occurrence of a ground fault;
- a current transformer detecting the fault current and outputting a secondary current at the detection of the fault current;
- a flash bulb having an airtight bulb made of glass, said bulb accommodating a filament and combustion fibers, said bulb shattering when the combustion fibers are ignited;
- a plunger positioned to press against the bulb, said plunger cooperating with the ignited combustion fibers to shatter the bulb when the flash bulb is ignited, the plunger being displaced when the bulb shatters; and
- a permanent magnet attracting a magnet substance which is fixed to a lower end of the plunger, said permanent magnet holding the indicator in the holder so as not to move the indicator downward when the plunger is positioned at the original position, said magnet substance being forced to be moved so as to be brought out of the magnetic field of the permanent magnet and allow the indicator to move downward from the holder by its own weight when the bulb shatters.

22. An indicating device as recited in claim 21 further comprising a trigger member forcing the permanent magnet to be moved away from the magnet substance when the plunger shatters the bulb.

* * * * *